United States Patent
Fang et al.

(10) Patent No.: US 9,741,610 B2
(45) Date of Patent: Aug. 22, 2017

(54) SACRIFICIAL AMORPHOUS SILICON HARD MASK FOR BEOL

(71) Applicant: GLOBALFOUNDRIES Inc., Grand Caymay (KY)

(72) Inventors: Qiang Fang, Ballston Lake, NY (US); Zhiguo Sun, Halfmoon, NY (US); Jiehui Shu, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/740,035

(22) Filed: Jun. 15, 2015

(65) Prior Publication Data

US 2016/0365277 A1 Dec. 15, 2016

(51) Int. Cl.
*H01L 29/40* (2006.01)
*H01L 21/768* (2006.01)
*H01L 23/532* (2006.01)
*H01L 23/522* (2006.01)
*H01L 21/311* (2006.01)

(52) U.S. Cl.
CPC .. *H01L 21/76879* (2013.01); *H01L 21/31144* (2013.01); *H01L 21/7684* (2013.01); *H01L 21/76802* (2013.01); *H01L 21/76843* (2013.01); *H01L 23/5226* (2013.01); *H01L 23/53238* (2013.01)

(58) Field of Classification Search
CPC ......... H01L 21/76879; H01L 21/76802; H01L 21/7684; H01L 21/76843; H01L 23/5226; H01L 23/53238

USPC ........ 257/751, 752, 758; 438/618, 622, 624, 438/625, 626, 631
See application file for complete search history.

(56) References Cited

U.S. PATENT DOCUMENTS

| | | | |
|---|---|---|---|
| 7,618,889 B2 * | 11/2009 | Naik | H01L 21/31116 257/E21.579 |
| 8,466,522 B2 * | 6/2013 | Ezaki | B06B 1/0292 257/416 |
| 2004/0198062 A1 * | 10/2004 | Ye | H01L 21/7684 438/706 |
| 2005/0127348 A1 * | 6/2005 | Horak | H01L 45/06 257/3 |
| 2014/0175617 A1 | 6/2014 | Antonelli et al. | |

FOREIGN PATENT DOCUMENTS

TW 201440123 A 10/2014

* cited by examiner

*Primary Examiner* — Victor A Mandala
*Assistant Examiner* — Colleen E Snow
(74) *Attorney, Agent, or Firm* — Wayne F. Reinke, Esq.; Heslin Rothenberg Farley & Mesiti P.C.

(57) ABSTRACT

A starting metallization structure for electrically coupling one or more underlying semiconductor devices, the structure including a bottom layer of dielectric material with metal-filled via(s) situated therein, a protective layer over the bottom layer, and a top layer of dielectric material over the protective layer. A sacrificial layer of amorphous silicon is formed over the top layer of dielectric material, a protective layer is formed over the sacrificial layer and via(s) through each layer above the metal-filled via(s) to expose the metal of the metal-filled via(s). The protective layer is then selectively removed, as well as the sacrificial layer of amorphous silicon.

9 Claims, 3 Drawing Sheets

SACRIFICIAL AMORPHOUS SILICON HARD MASK FOR BEOL

BACKGROUND OF THE INVENTION

Technical Field

The present invention generally relates to metallization for semiconductor devices. More particularly, the present invention relates to improving copper seed coverage during Back End of the Line (BEOL) metallization.

Background Information

As devices shrink, metallization becomes more of a problem and sufficient copper seed coverage over the device feature becomes critical. Discontinuous copper seed coverage leads to poor copper plating and a "copper line void." One attempted solution uses a sacrificial silicon nitride layer, which is removed using dilute hydrofluoric acid prior to formation of copper barrier and copper seed layers. The effect lowers the overall dielectric height to improve the copper seed coverage over the features. However, while metallization defects improved, the sacrificial silicon nitride itself may introduce other defects and potentially lend to dielectric breakdown.

Thus, a need exists for a way to reduce or eliminate discontinuous copper seed coverage in BEOL metallization.

SUMMARY OF THE INVENTION

The shortcomings of the prior art are overcome and additional advantages are provided through the provision, in one aspect, of a method of semiconductor device metallization. The method includes providing a starting metallization structure for electrically coupling one or more underlying semiconductor devices, the structure including a bottom layer of dielectric material with one or more metal-filled vias therethrough situated therein, the bottom layer of dielectric material being situated on a structure for the one or more underlying semiconductor devices, the starting metallization structure further includes a first protective layer over the bottom layer, and a top layer of dielectric material over the first protective layer. The method further includes forming a sacrificial layer of amorphous silicon over the top layer of dielectric material; forming a second protective layer over the sacrificial layer, the second protective layer including a metal nitride, forming at least one via through each layer above the one or more metal-filled vias to expose the metal of one or more metal-filled vias, selectively removing a remainder of the second protective layer after forming the at least one via, and removing the sacrificial layer of amorphous silicon.

In a second aspect, an intermediate semiconductor structure is provided. The semiconductor structure includes a metallization structure for electrically coupling one or more underlying semiconductor devices, the structure including a bottom layer of dielectric material with one or more metal-filled vias therethrough situated therein, the bottom layer of dielectric material being situated on a structure for the one or more underlying semiconductor devices, the starting metallization structure further includes a first protective layer over the bottom layer, and a top layer of dielectric material over the first protective layer. The structure further includes a sacrificial layer of amorphous silicon over the top layer of dielectric material, a second protective layer over the sacrificial layer, the second protective layer including a metal nitride, and at least one via through each layer above the one or more metal-filled vias to expose the metal of the one or more metal-filled vias.

These, and other objects, features and advantages of this invention will become apparent from the following detailed description of the various aspects of the invention take in conjunction with the accompanying drawings.

DETAILED DESCRIPTION OF THE INVENTION

Figure 1:
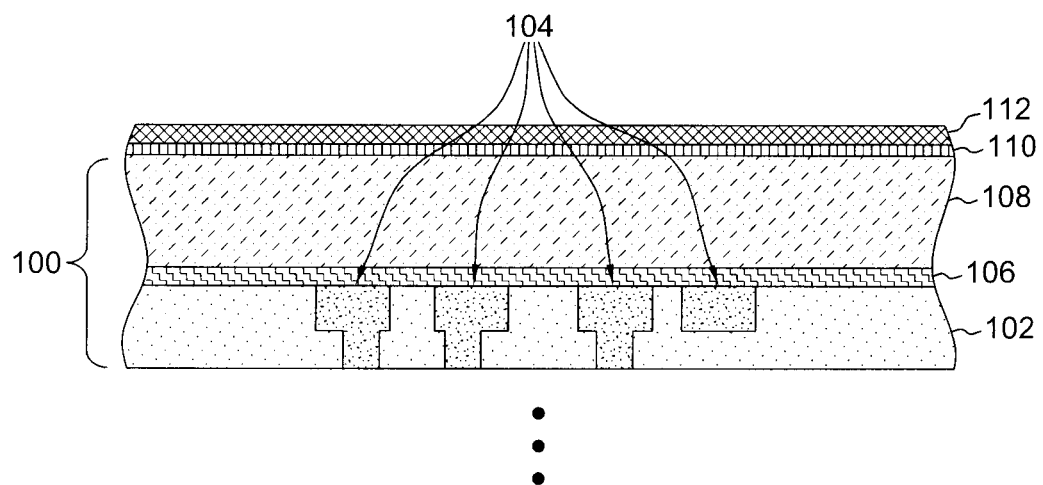
FIG. 1 is a cross-sectional view of one example of a starting metallization structure for electrically coupling to one or more underlying semiconductor devices, the structure including a bottom layer of dielectric material with one or more metal-filled vias situated therein, a protective layer over the bottom layer and a top layer of dielectric material (e.g., an inter-layer dielectric) over the protective layer. Also shown in FIG. 1 is a sacrificial layer of amorphous silicon over the starting metallization structure and a protective layer over the sacrificial layer, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

FIG. 1 is a cross-sectional view of one example of a starting metallization structure 100 for electrically coupling to one or more underlying semiconductor devices (not shown; e.g., transistors), the structure including a bottom layer 102 of dielectric material with one or more metal-filled vias 104 situated therein (e.g., copper), a protective layer 106 over the bottom layer and a top layer 108 of dielectric material (e.g., an inter-layer dielectric) over the protective layer. Also shown in FIG. 1 is a sacrificial layer 110 of amorphous silicon over the starting metallization structure and a protective layer 112 over the sacrificial layer, in accordance with one or more aspects of the present invention.

Dielectric layer 102 may be any suitable dielectric (e.g., silicon dioxide). Protective layer 106 may include, for example, a hard mask material, e.g., silicon nitride. Dielectric layer 108 may include, for example, an ultra-low-k dielectric (i.e., having a dielectric constant of about 2.6 or less). The protective layer 112, e.g., a metal hard mask, may include, for example, a metal nitride (e.g., titanium nitride, aluminum nitride, tungsten nitride, etc.).

The starting metallization structure may be conventionally fabricated, for example, using known processes and techniques. Further, unless noted otherwise, conventional processes and techniques may be used to achieve individual steps of the fabrication process of the present invention. However, although only a portion of the overall structure is shown for simplicity, it will be understood that, in practice, many such structures are typically included over multiple commonly fabricated semiconductor devices. Formation of layers 110 and 112 can be accomplished using, for example, one or more conventional processes and techniques.

Figure 2:
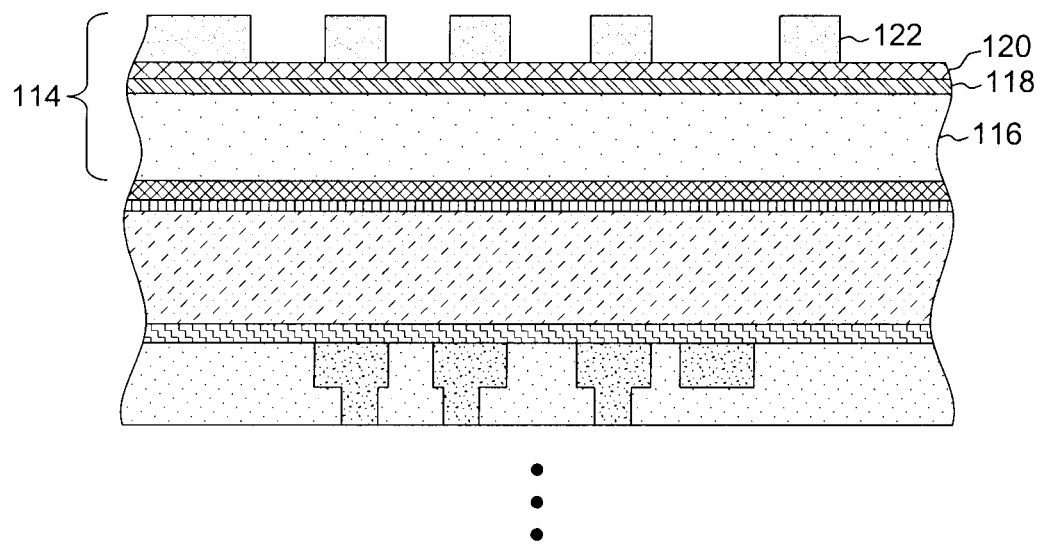
FIG. 2 depicts one example of the structure of FIG. 1, after forming a lithographic stack over the protective layer, the lithographic stack including, for example, a bottom hard mask layer (e.g., a spin-on hard mask), a layer of silicon oxynitride over the bottom hard mask layer, a bottom anti-reflective coating (BARC) layer over the layer of silicon oxynitride, and a patterned layer of lithographic blocking material (e.g. photo resist) over the BARC layer, in accordance with one or more aspects of the present invention

FIG. 2 depicts one example of the structure of FIG. 1 after forming a lithographic stack 114 over the protective layer 112, the lithographic stack including, for example, a bottom hard mask layer 116 (e.g., spin-on hard mask), a layer 118 of silicon oxynitride over the bottom hard mask layer, a bottom anti-reflective coating (BARC) layer 120 over the layer of silicon oxynitride, and a patterned layer 122 of lithographic blocking material (e.g., photo resist) over the BARC layer in accordance with one or more aspects of the present invention. Formation of the lithographic stack and patterned layer may be accomplished using, for example, one or more conventional processes and techniques.

Figure 3:
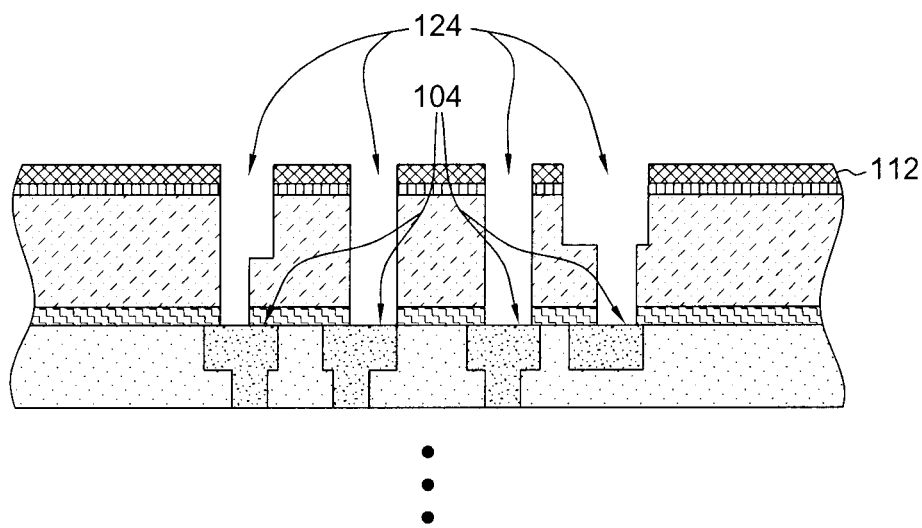
FIG. 3 depicts one example of the structure of FIG. 2 after using the lithographic stack and a reactive ion etching process to create an opening through the various layers to each of the one or more metal-filled vias, in accordance with one or more aspects of the present invention.

FIG. 3 depicts one example of the structure of FIG. 2 after employing the lithographic stack (114, FIG. 2) and, for example, a reactive ion etching process to create openings 124 through the various layers to the one or more metal-filled vias 104, in accordance with one or more aspects of the present invention.

Figure 4:
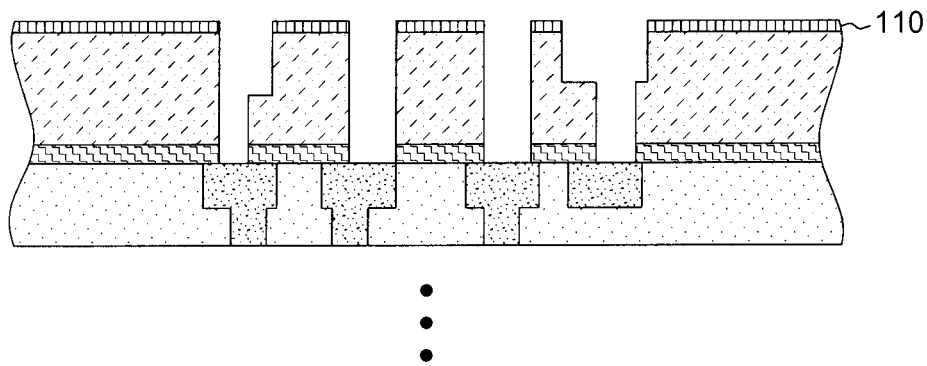
FIG. 4 depicts one example of the structure of FIG. 3 after selectively removing the protective layer, exposing the sacrificial layer of amorphous silicon, in accordance with one or more aspects of the present invention.

FIG. 4 depicts one example of the structure of FIG. 3 after selectively removing the protective layer (112, FIG. 3), exposing the sacrificial layer 110 of amorphous silicon, in accordance with one or more aspects of the present invention. Removing the protective layer may be accomplished for example, using one or more conventional processes and techniques.

Figure 5:
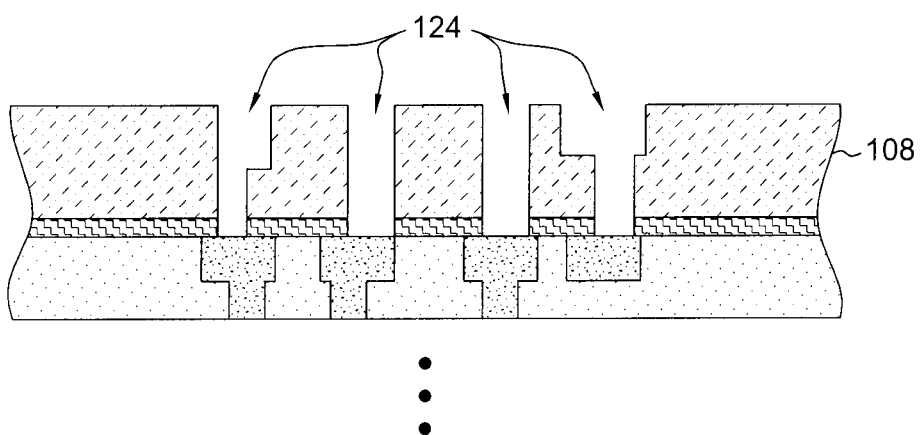
FIG. 5 depicts one example of the structure of FIG. 4 after removing the sacrificial layer, exposing the top layer of dielectric material, in accordance with one or more aspects of the present invention.

FIG. 5 depicts one example of the structure of FIG. 4 after removing the sacrificial layer (110, FIG. 4), exposing the top layer 108 of dielectric material, in accordance with one or more aspects of the present invention. Removal of the sacrificial layer of amorphous silicon may be accomplished, for example using a selective wet etch (e.g., a solution of tetramethylammonium hydroxide [TMAH]).

Figure 6:
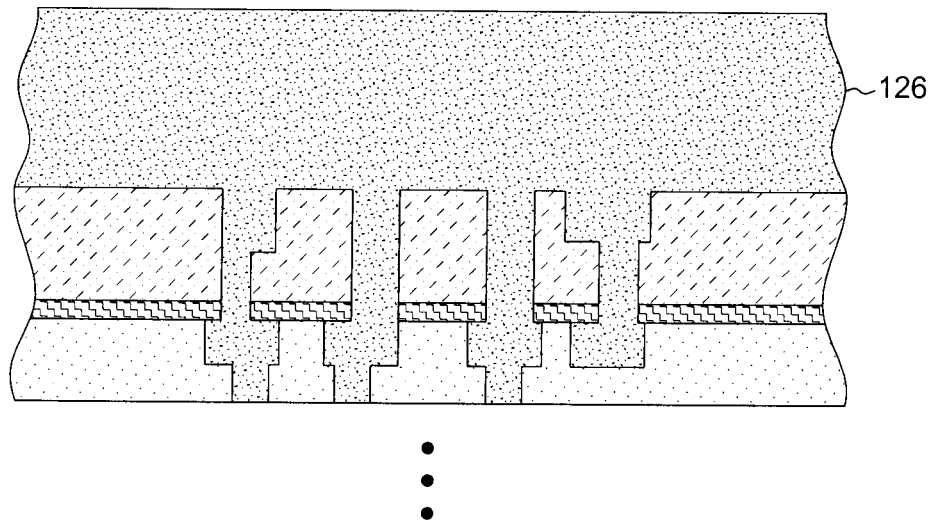
FIG. 6 depicts one example of the structure of FIG. 5 after filling the vias with conductive material (e.g., copper), in accordance with one or more aspects of the present invention.

FIG. 6 depicts one example of the structure of FIG. 5 after filling the vias (124, FIG. 5) with conductive material 126 (e.g., copper), in accordance with one or more aspects of the present invention. In one example, copper filling may be accomplished, for example, using a copper plating process.

Figure 7:
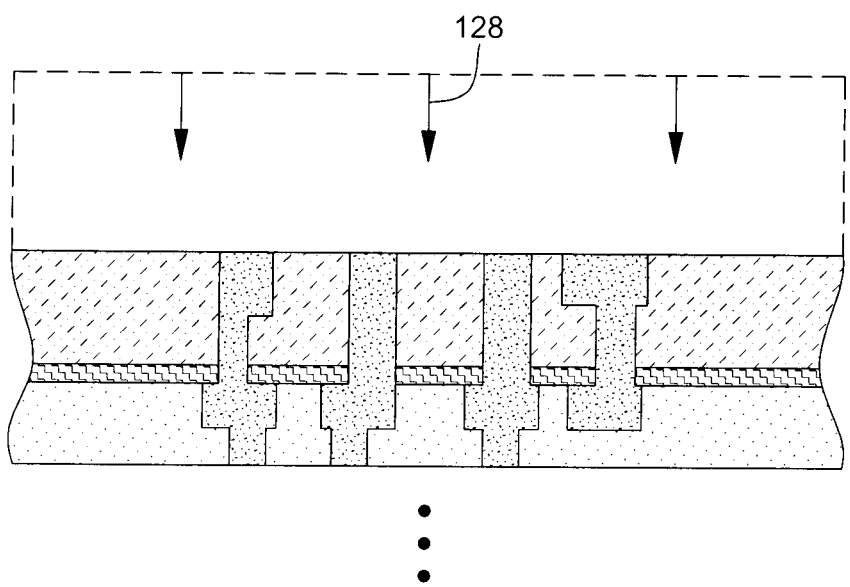
FIG. 7 depicts one example of the structure of FIG. 6 after planarizing (e.g., using a chemical-mechanical polishing process) to expose the conductive material of the vias, in accordance with one or more aspects of the present invention.

FIG. 7 depicts one example of the structure of FIG. 6 after planarizing 128 (e.g., using a chemical-mechanical polishing process) to expose the conductive material 126 of the vias (124, FIG. 5), in accordance with one or more aspects of the present invention.

In a first aspect, disclosed above is a method of semiconductor device metallization. The method includes providing a starting metallization structure for electrically coupling underlying semiconductor device(s), the structure including a bottom layer of dielectric material with metal-filled via(s) situated therein, a protective layer over the bottom layer, and a top layer of dielectric material over the protective layer. The method further includes forming a sacrificial layer of amorphous silicon over the top layer of dielectric material; forming a protective layer over the sacrificial layer, and forming via(s) through each layer above the metal-filled via(s) to expose the metal of the metal-filled via(s).

In one example, the method may further include, for example, selectively removing the protective layer, and removing the sacrificial layer of amorphous silicon. In one example, removing the sacrificial layer of amorphous silicon may include, for example, employing a selective wet etching process. In one example, the selective wet etching process may include, for example, using a solution of tetramethyl-ammonium hydroxide (TMAH).

In one example, forming the via(s) in the method of the first aspect may include, for example, employing a reactive ion etching process.

In other example, forming the via(s) may include, for example, employing lithography. In one example, forming the via(s) by lithography may further include, for example, employing a reactive ion etching process.

In one example, the method of the first aspect may further include, for example, filling the via(s) with conductive material.

In one example, the filling may include, for example, employing a copper plating process. In another example, the filling may include, for example, overfilling the at least one via with the conductive material, and planarizing excess conductive material to expose the filled via(s).

In a second aspect, disclosed above is an intermediate semiconductor structure. The semiconductor structure includes a metallization structure for electrically coupling underlying semiconductor device(s), the structure including a bottom layer of dielectric material with metal-filled via(s) situated therein, a protective layer over the bottom layer, and a top layer of dielectric material over the protective layer. The structure further includes a sacrificial layer of amorphous silicon over the top layer of dielectric material, a protective layer over the sacrificial layer, and via(s) through each layer above the metal-filled via(s) to expose the metal of the metal-filled via(s).

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
providing a starting metallization structure for electrically coupling one or more underlying semiconductor devices, the structure comprising a bottom layer of dielectric material with one or more metal-filled vias therethrough situated therein, the bottom layer of dielectric material being situated on a structure for the one or more underlying semiconductor devices, the starting metallization structure further comprising a first protective layer over the bottom layer, and a top layer of dielectric material over the first protective layer;
forming a sacrificial layer of amorphous silicon over the top layer of dielectric material;
forming a second protective layer over the sacrificial layer, the second protective layer comprising a metal nitride;
forming at least one via through each layer above the one or more metal-filled vias to expose the metal of the one or more metal-filled vias;
selectively removing a remainder of the second protective layer after forming the at least one via; and
removing the sacrificial layer of amorphous silicon.

2. The method of claim 1, wherein removing the sacrificial layer of amorphous silicon comprises employing a selective wet etching process.

3. The method of claim 2, wherein the selective wet etching process comprises using a solution of tetramethyl-ammonium hydroxide (TMAH).

4. The method of claim 1, wherein forming the at least one via comprises employing a reactive ion etching process.

5. The method of claim 1, wherein forming the at least one via comprises employing lithography.

6. The method of claim 5, wherein forming the at least one via further comprises employing a reactive ion etching process.

7. The method of claim 1, further comprising filling the at least one via with conductive material.

8. The method of claim 7, wherein the filling comprises employing a copper plating process.

9. The method of claim 7, wherein the filling comprises:
overfilling the at least one via with the conductive material; and
planarizing excess conductive material to expose the filled at least one via.

* * * * *